(12) United States Patent
Mokhlesi et al.

(10) Patent No.: US 8,284,609 B2
(45) Date of Patent: Oct. 9, 2012

(54) COMPENSATION OF NON-VOLATILE MEMORY CHIP NON-IDEALITIES BY PROGRAM PULSE ADJUSTMENT

(75) Inventors: Nima Mokhlesi, Los Gatos, CA (US); Dengtao Zhao, Sunnyvale, CA (US); Henry Chin, Palo Alto, CA (US); Tapan Samaddar, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/151,938

(22) Filed: Jun. 2, 2011

(65) Prior Publication Data

US 2011/0235428 A1 Sep. 29, 2011

Related U.S. Application Data

(62) Division of application No. 11/862,485, filed on Sep. 27, 2007, now Pat. No. 7,978,520.

(51) Int. Cl.
*G11C 11/34* (2006.01)
*G11C 16/04* (2006.01)

(52) U.S. Cl. .......... 365/185.19; 365/185.18; 365/185.24

(58) Field of Classification Search ............. 365/185.19, 365/185.02, 185.22, 185.18, 185.29, 185.28, 365/185.17, 185.24
See application file for complete search history.

(56) References Cited

U.S. PATENT DOCUMENTS

| 6,882,567 | B1 | 4/2005 | Wong |
| 6,894,931 | B2 | 5/2005 | Yaegashi |
| 6,937,520 | B2 | 8/2005 | Ono |
| 7,020,026 | B2 | 3/2006 | Guterman |
| 7,054,193 | B1 | 5/2006 | Wong |
| 7,139,192 | B1 | 11/2006 | Wong |
| 2008/0316833 | A1 | 12/2008 | Fong |
| 2010/0008145 | A1* | 1/2010 | Wang ........................ 365/185.19 |

FOREIGN PATENT DOCUMENTS

| EP | 0830684 | 8/2004 |
| WO | 0169604 | 9/2001 |

OTHER PUBLICATIONS

Office Action dated Mar. 3, 2010, U.S. Appl. No. 11/862,485, filed Sep. 27, 2007.
Response to Office Action dated Apr. 2, 2010, U.S. Appl. No. 11/862,485, filed Sep. 27, 2007.
Office Action dated Jul. 20, 2010, U.S. Appl. No. 11/862,485, filed Sep. 27, 2007.
Response to Office Action dated Dec. 16, 2010, U.S. Appl. No. 11/862,485, filed Sep. 27, 2007.
Notice of Allowance dated Mar. 3, 2011, U.S. Appl. No. 11/862,485, filed Sep. 27, 2007.

* cited by examiner

*Primary Examiner* — VanThu Nguyen
*Assistant Examiner* — Hien Nguyen
(74) *Attorney, Agent, or Firm* — Vierra Magen Marcus & DeNiro LLP

(57) ABSTRACT

To program a set of non-volatile storage elements, a set of programming pulses are applied to the control gates (or other terminals) of the non-volatile storage elements. The programming pulses have pulse widths that vary as a function of simulated pulse magnitude data. The programming pulses can also have pulse magnitudes that vary based on measurements taken while testing the set of non-volatile storage elements. In one embodiment, the pulse widths are determined after simulation performed prior to fabrication of the non-volatile storage elements. In another embodiment, the pulse magnitudes are calculated after fabrication of the non-volatile storage elements.

12 Claims, 12 Drawing Sheets

Fig 16
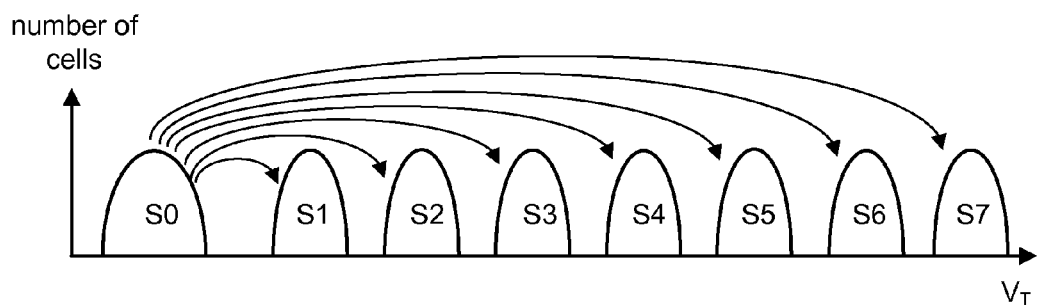
Fig 18
|  | First Page | Second Page | Third Page |
|---|---|---|---|
| WL0 | 1 | 3 | 6 |
| WL1 | 2 | 5 | 9 |
| WL2 | 4 | 8 | 11 |
| WL3 | 7 | 10 | 12 |
Fig. 19
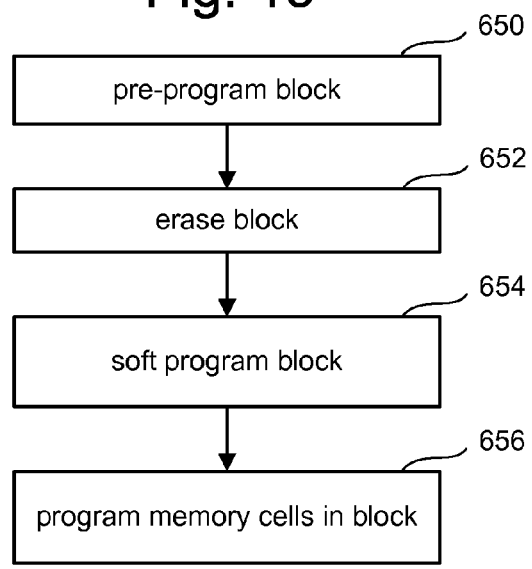

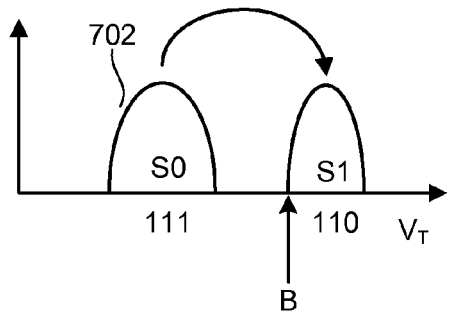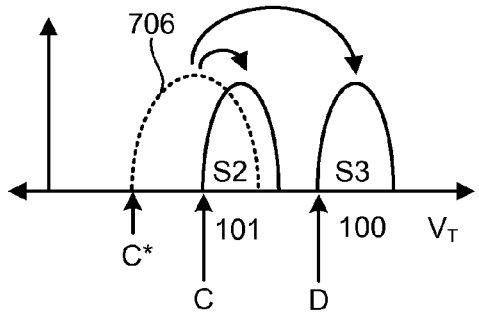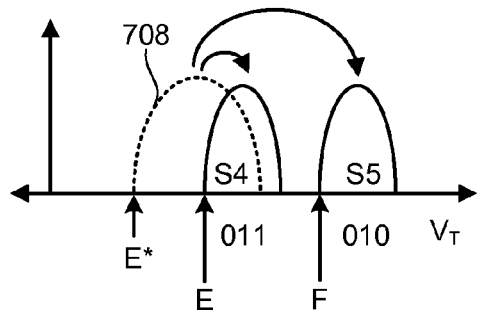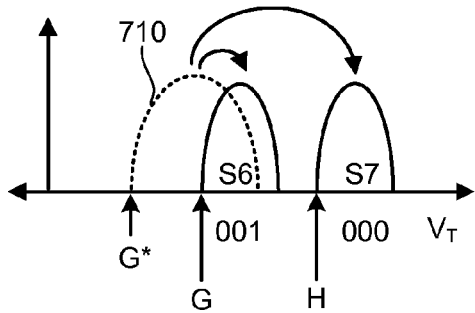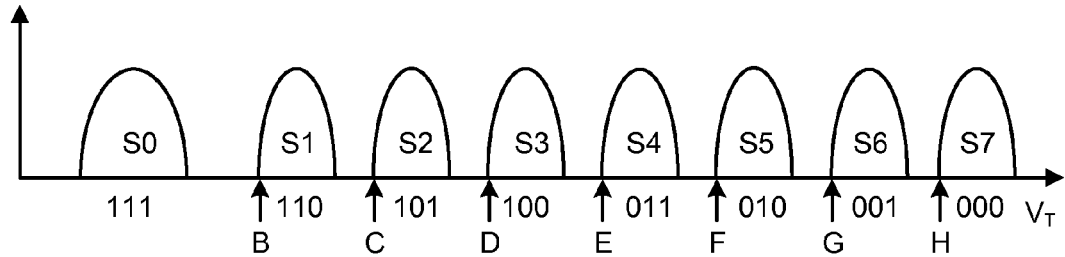

COMPENSATION OF NON-VOLATILE MEMORY CHIP NON-IDEALITIES BY PROGRAM PULSE ADJUSTMENT

CLAIM OF PRIORITY

This application is a divisional application of U.S. patent application Ser. No. 11/862,485, "COMPENSATION OF NON-VOLATILE MEMORY CHIP NON-IDEALITIES BY PROGRAM PULSE ADJUSTMENT," filed on Sep. 27, 2007 by Mokhlesi, which is incorporated herein by reference in its entirety.

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

Each memory cell can store data (analog or digital). When storing one bit of digital data (referred to as a binary memory cell), possible threshold voltages of the memory cell are divided into two ranges which are assigned logical data "1" and "0." In one example of a NAND type flash memory, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00." If eight levels of information (or states) are stored in each memory cell (e.g. for three bits of data), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. Nos. 6,222,762 and 7,237,074, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells. Different encoding schemes can be used.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Pat. No. 6,917,542, titled "Detecting Over Programmed Memory," both of which are incorporated herein by reference in their entirety.

Typically, the program voltage applied to the control gate during a program operation is applied as a series of pulses. In many implementations, the magnitude of the pulses is increased with each successive pulse by a predetermined step size while the duration of the each pulse remains the same. However, due to non-idealities on the memory chip containing the memory cell, the actual programming pulses experienced by the memory cells may vary from the intended signal, which can lead to wide threshold voltage distributions or unnecessary conservative timings.

One specific non-ideal element used in many implementations of a memory chip is the charge pump. The charge pump is used to supply voltage to a word line for programming memory cells. When a charge pump is initially connected to the word line, the output of the charge pump drops quickly and may take a certain amount of time to recover to the desired output. At smaller voltages, the effect seen by this recovery time is relatively negligible. However, at higher voltages, the recovery time is longer, and the charge pump becomes less ideal. The effective voltage seen by the memory cells is lower than the intended voltage, which can lead to wide threshold voltage distributions. Moreover, if, in the interest of increasing performance, the programming pulse duration was shortened, this effect would be further exacerbated.

In many implementations, the programming pulse durations for all pulses of a programming signal are set for the case of the highest programming voltage used in the programming signal (i.e. worst-case scenario). This ensures that the charge pump has enough time to recover to the desired value for all voltages used in the programming signal. However, this leads to slower programming of the memory cells.

Thus, there is a need to compensate for chip non-idealities in order to increase programming performance.

SUMMARY

The technology described herein pertains to compensation for memory chip non-idealities by varying the pulse widths and/or pulse magnitudes of pulses of a programming signal in order to improve programming performance. One example of this compensation includes varying the pulse widths of pulses of a programming signal as a function of the pulse magnitude. Another example adjusts pulse magnitudes based on measurements taken during testing of the memory chip. Additionally, the pulse widths and pulse magnitudes of pulses of a programming signal can be varied using techniques other than those described above.

One embodiment includes applying a programming signal to a non-volatile storage element, including applying multiple programming pulses with pulse widths that vary as a function of pulse magnitude data associated with the multiple programming pulses.

One embodiment includes a non-volatile storage element and one or more managing circuits in communication with the non-volatile storage element. The one or more managing circuits program the non volatile storage element by applying multiple programming pulses with pulse widths that vary as a function of pulse magnitude data associated with the multiple programming pulses.

One embodiment includes determining pulse widths for multiple programming pulses of a programming signal based on a simulation of a plurality of memory devices and calculating pulse magnitudes for a particular memory device within the plurality of memory devices subsequent to fabrication of the particular memory device. The process also includes applying the programming signal to the particular memory device.

One embodiment includes a particular memory device from a plurality of memory devices and one or managing circuits in communication with the particular memory device. The one or more managing circuits program the particular memory device by applying programming pulses with pulse widths determined based on a simulation of the plurality of memory devices and pulse magnitudes calculated subsequent to fabrication of the particular memory device.

One embodiment includes applying a programming signal to a non-volatile storage system. The process also includes varying pulse widths and varying pulse magnitudes for programming pulses of the programming signal while the programming signal is applied to the non-volatile storage system. The pulse widths are varied as a function of simulated pulse magnitude data for the programming pulses, and the pulse magnitudes are varied based on a physical test of the storage system.

One embodiment includes a non-volatile storage element of a storage system, means for applying a programming signal to the non-volatile storage element, means for varying pulse widths for programming pulses of the programming signal while applying the programming signal to the non-volatile storage element, and means for varying pulse magnitudes for the programming pulses of the programming signal while applying the programming signal to the non-volatile storage element. The means for varying the pulse widths for the programming pulses of the programming signal varies the pulse widths as a function of simulated pulse magnitude data for the programming pulses. The means for varying the pulse magnitudes for the programming pulses of the programming signal varies the pulse magnitudes based on a physical test of the storage system.

BRIEF DESCRIPTION OF THE DRAWINGS

FIG. 16 depicts an example set of threshold voltage distributions and describes a process for programming non-volatile memory.
FIGS. 17A-I show various threshold voltage distributions and describe a process for programming non-volatile memory.
FIG. 18 is a table depicting one example of an order of programming non-volatile memory.
FIG. 19 is a flow chart describing one embodiment of a process for programming non-volatile memory.

DETAILED DESCRIPTION

Figure 1:
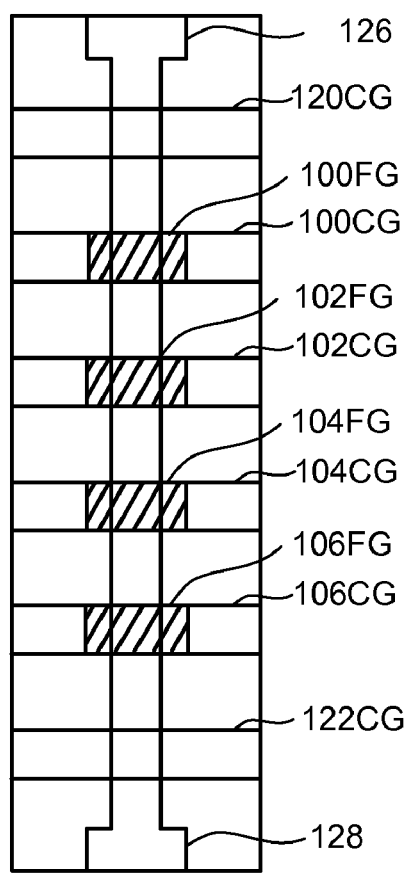
FIG. 1 is a top view of a NAND string.
Figure 2:
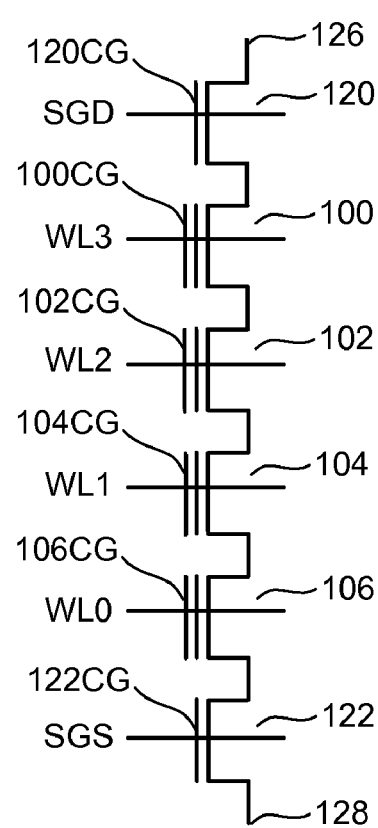
FIG. 2 is an equivalent circuit diagram of the NAND string.

One example of a flash memory system uses the NAND structure, which includes arranging multiple transistors in series and sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. patents/Patent Applications, all of which are incorporated herein by reference: U.S. Pat. Nos. 5,570,315; 5,774,397; 6,046,935; 6,456,528; and 6,522,580. The discussion herein can also apply to other types of flash memory in addition to NAND, as well as other types of non-volatile memory.

Other types of non-volatile storage devices, in addition to NAND flash memory, can also be used. For example, a so-called TANOS structure (consisting of a stacked layer of TaN—Al$_2$O$_3$—SiN—SiO$_2$ on a silicon substrate), which is basically a memory cell using trapping of charge in a nitride layer (instead of a floating gate), can also be used with the present invention. Another memory cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
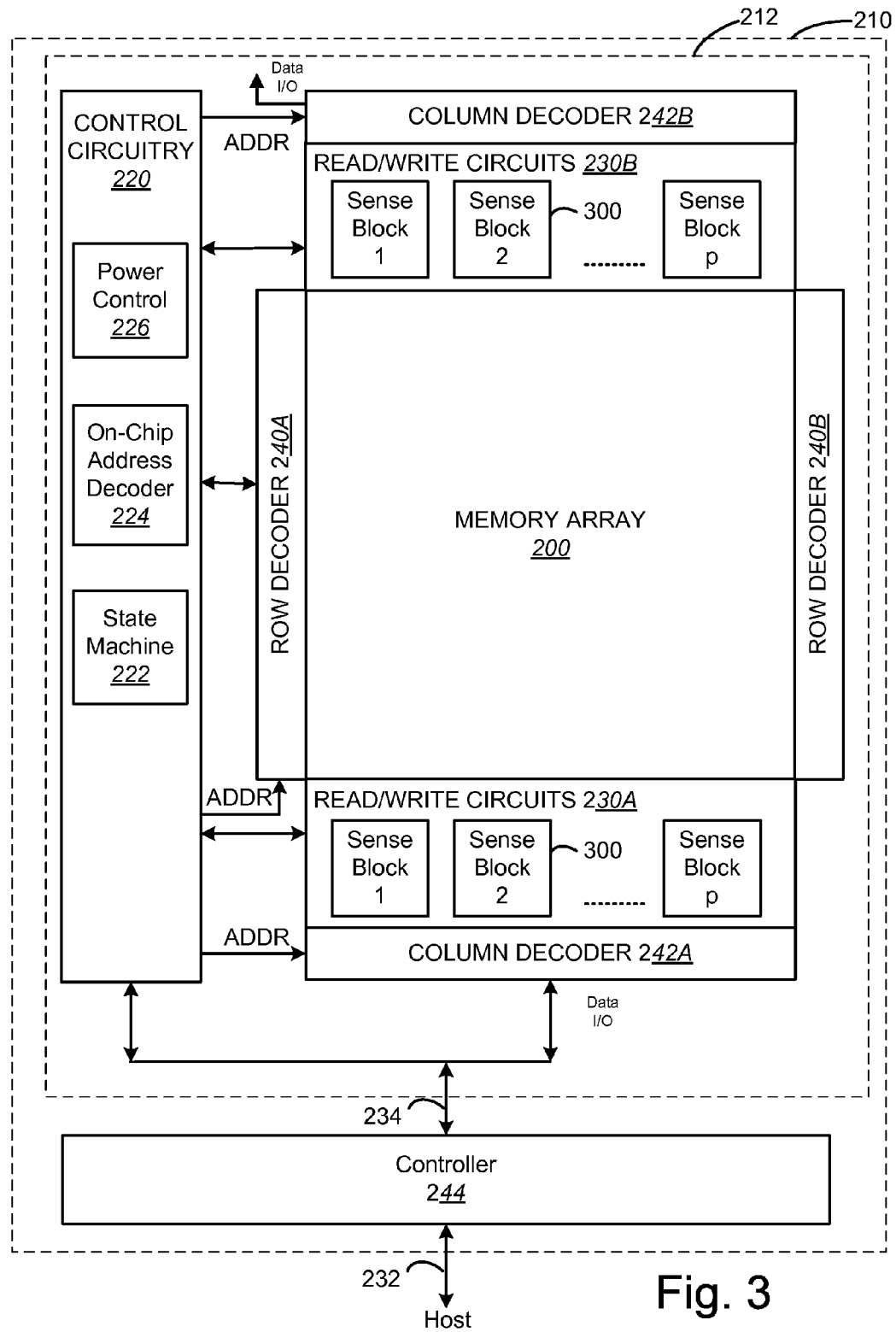
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
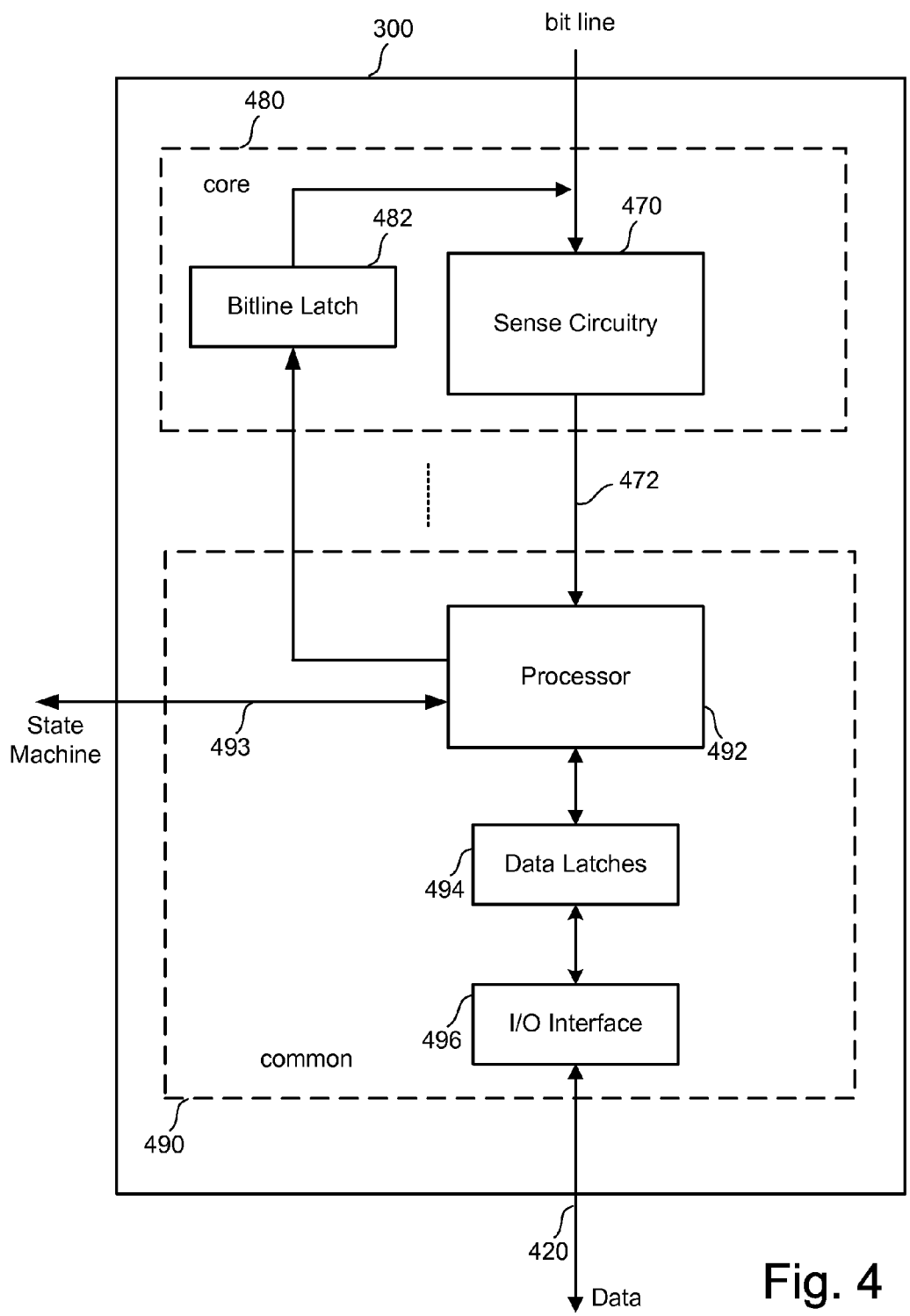
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'ed together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) U.S. Pat. No. 27,196,931, "Non-Volatile Memory And Method With Reduced Source Line Bias Errors," published on Mar. 25, 2004; (2) U.S. Pat. No. 7,023,736, "Non-Volatile Memory And Method with Improved Sensing," published on Jun. 10, 2004; (3) U.S. Pat. No. 7,046,568; (4) U.S. Pat. No. 7,196,928, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5:
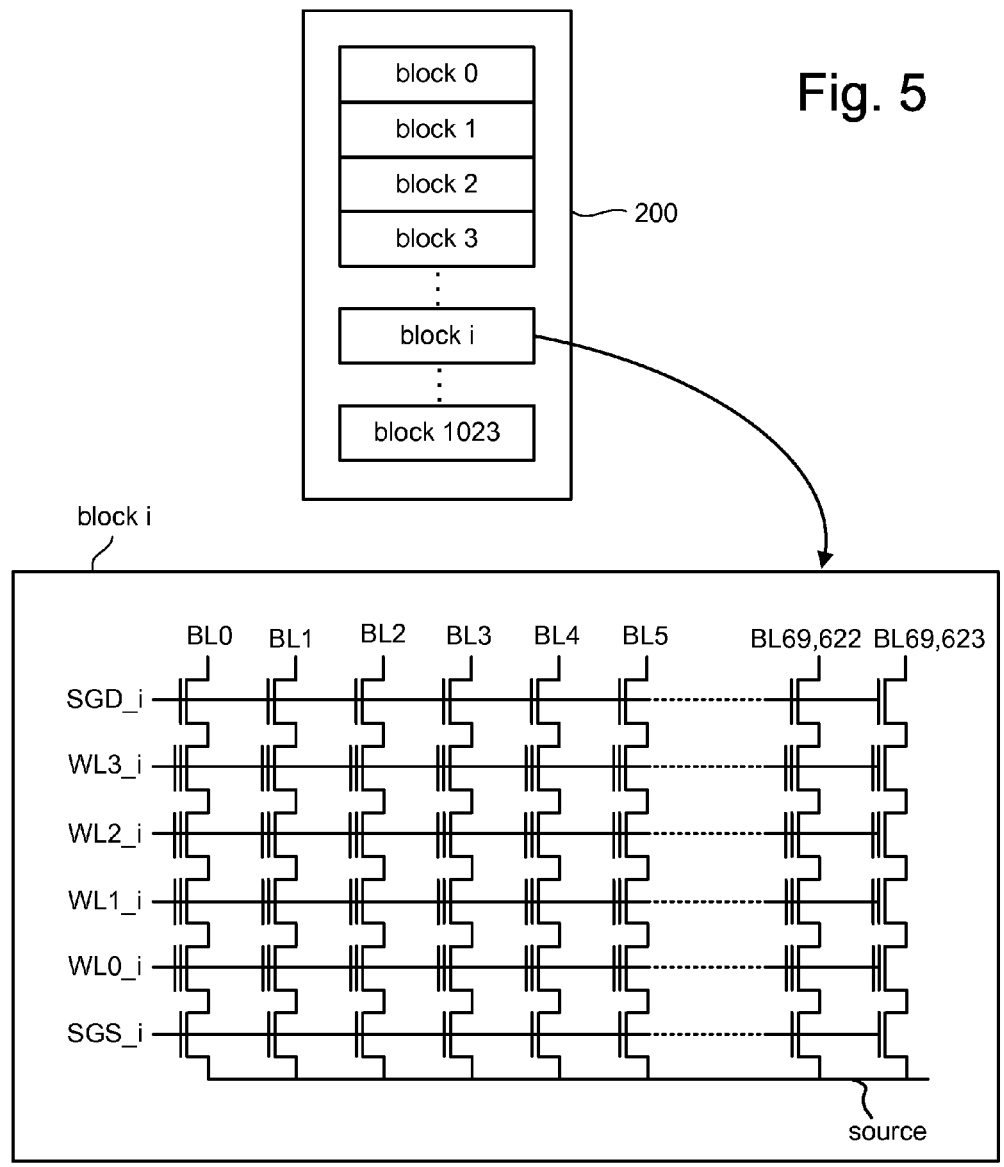
FIG. 5 is a block diagram depicting one embodiment of a memory array.

FIG. 5 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together.

A block contains a set of NAND stings which are accessed via bit lines (e.g., bit lines BL0-BL69623) and word lines (WL0, WL1, WL2, WL3). FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

In one embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time. In another embodiment, all memory cells connected to a common word line are programmed together.

Each block is typically divided into a number of pages. In one embodiment, a page is a unit of programming. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Typically, one or more charge pumps within the power control module 226 of FIG. 3 supply voltages to a word line. The voltages supplied to the floating gates on a word line are reached more quickly depending on how close or far the floating gate is located relative to the charge pump. For example, if a charge pump is supplying a voltage to word line WL3_i (see FIG. 5), it would take longer for the voltage to reach the memory cell on bit line BL69,623 than it would for the memory cell on bit line BL0. In one implementation, the pulse duration of a programming pulse is determined based on the time for a voltage to reach the last floating gate along a word line. This ensures each memory cell along the word line receives the intended voltage.

Figure 6:
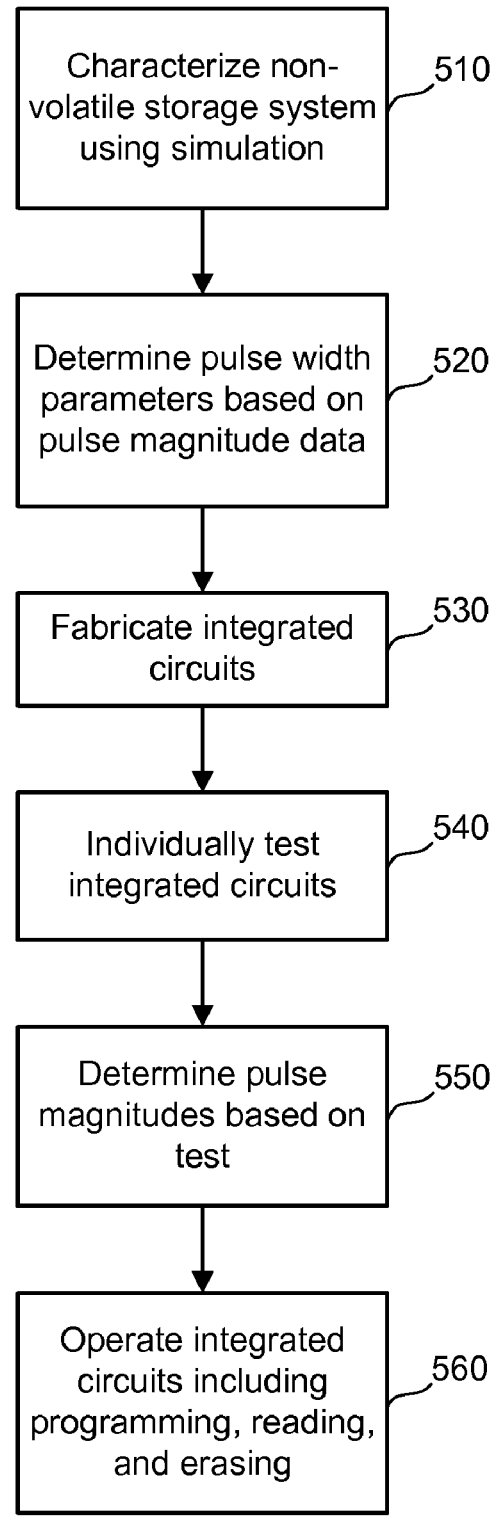
FIG. 6 is a flow chart describing one embodiment of a process for manufacturing and using a non-volatile storage system.

FIG. 6 is a flow chart describing one embodiment of a process for determining and applying a programming signal to a non-volatile storage system. In step 510, the non-volatile storage system is characterized using simulation. In one implementation, this step is performed prior to fabrication of the non-volatile storage system. In another implementation, the characterization is performed using a simulation of the programming voltage rise time for various programming voltage magnitudes of a programming signal to be applied to the non-volatile storage system.

The data produced from the simulations obtained in step 510 produce pulse magnitude data, which include the pulse magnitudes observed during simulation. In one implementation, the pulse magnitudes observed during a simulation of programming voltage rise time for the various programming voltage magnitudes of a programming signal applied to a memory cell are referred to as pulse magnitude data. Although simulated pulse magnitude data are described, pulse magnitude data is not only limited to pulse magnitudes observed during simulation. Pulse magnitude data can also include actual pulse magnitudes applied to the non-volatile storage system.

In step 520, the pulse magnitude data obtained during simulation are used to determine the pulse width parameters for pulses of a programming signal. The pulse width parameters indicate the pulse width sizes that should be used for pulses of the programming signal. The explanations of FIGS. 9-10 below describe in greater detail how the pulse magnitude data is used to determine the pulse width parameters for a non-volatile storage system.

In step 530, integrated circuits for the simulated and characterized non-volatile storage elements are fabricated. In one implementation, integrated circuits for the simulated and characterized non-volatile storage elements are fabricated for multiple non-volatile memory chips.

In step 540, the fabricated circuits are individually tested for each memory chip. This chip-by-chip testing is performed due to non-idealities in each individual chip. In one implementation, threshold voltages are tested as different programming voltage magnitudes are applied to the integrated circuits of a memory chip.

In step 550, the pulse magnitudes are determined based on the testing performed in step 540. The pulse magnitudes are determined on a chip-by-chip basis. In one implementation, the pulse magnitudes are determined to correct for threshold voltage error found during testing. The explanations of FIGS. 13-14 below describe in greater detail how the pulse magnitudes are determined.

An automated process can be used to program the pulse magnitudes determined in step 550 into registers of the control circuitry 220 (FIG. 3), which are used by the state machine 222 and the power control module 226 to set the pulse magnitudes.

In step 560, the integrated circuits are operated using pulses of a programming signal with pulse widths that are determined according to step 520 and pulse magnitudes that are determined according to step 550. Operating the integrated circuits includes programming, reading, and erasing.

Figure 7:
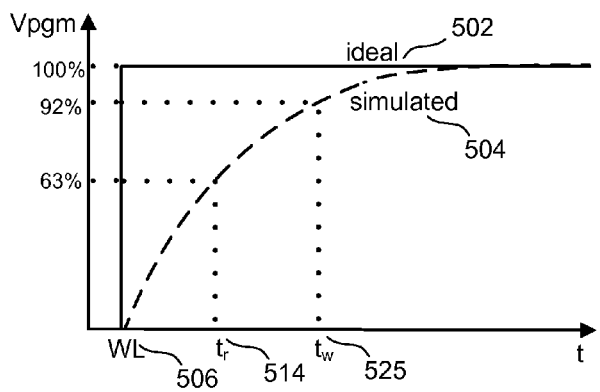
FIG. 7 is a graph that depicts one example of a portion of a programming signal experienced by a memory cell.

FIG. 7 illustrates one example of a simulation of pulse magnitudes that characterizes a non-volatile storage element for step 510 in FIG. 6 (i.e. pulse magnitude data). The plot shows an example of an ideal rise time 502 and a simulated rise time 504 for a programming voltage as experienced by a particular memory cell along a word line, i.e. the effective programming voltage at that particular memory cell. When a charge pump supplies a voltage to a word line, the magnitude of the effective programming voltage should ideally rise to the intended programming voltage (Vpgm) instantaneously, as shown by the solid line plot 502.

However, this is not realistically the case. The dashed line plot 504 shows the simulated effective programming voltage experienced by the particular memory cell. When the charge pump initially supplies a voltage to a word line, the magnitude of the effective voltage initially drops 506 at the instant the charge pump supplies voltage to the word line. Depending on certain factors (e.g. the location of the particular memory cell along the word line, the intended voltage to be supplied, etc.), it takes the charge pump some time to recover from the initial connection to the word line before the intended voltage is stably supplied. For higher voltages, this recovery time, or rise time, is longer. In one implementation, a simulation of rise time for the highest programming voltage applied in a programming signal is used to determine the pulse width parameters. In another implementation, a simulation of rise time for a memory cell at the end of a word line is used to determine pulse width parameters.

In another implementation, the rise time ($t_r$) is the time it takes for the simulated programming voltage to reach a particular percentage of the intended programming voltage. In FIG. 7, the rise time ($t_r$) 514 is defined as the time it takes the programming voltage to reach 63% of the programming voltage the charge pump attempts to reach, although the implementation is not limited to this particular percentage.

To properly program a memory cell, each programming pulse of a programming signal must be applied for at least a particular minimum amount of time. In one implementation, each programming pulse should have a pulse width ($t_w$) that is no shorter than the time it takes for the simulated programming voltage to reach a particular percentage of the intended programming voltage. In FIG. 7, the pulse width ($t_w$) 525 is defined as the time it takes the programming voltage to reach 92% of the programming voltage the charge pump attempts to reach, although the implementation is not limited to this particular percentage.

Figure 8:
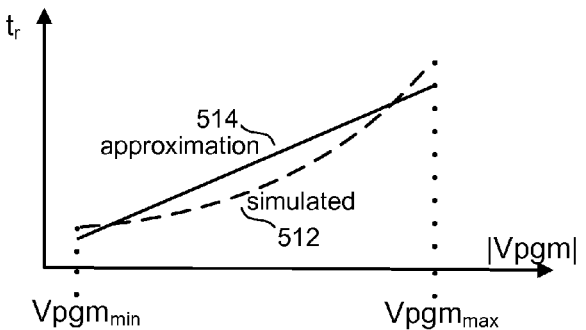
FIG. 8 is a graph that depicts one example of recovery time for different programming signal voltages supplied by a charge pump.

FIG. 8 shows another example of simulated pulse magnitude data obtained during step 510 of FIG. 6. The plot of FIG. 8 shows the rise time for a particular memory cell as different programming voltages of a programming signal are applied. In one implementation, this plot is simulated for the last memory cell along a word line (i.e. worst-case scenario).

Figure 9:
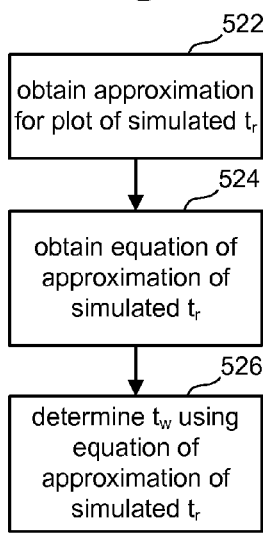
FIG. 9 is a flow chart describing one embodiment of a process for varying pulse duration of the program voltage.

The dashed line 512 of FIG. 8 shows the rise time obtained during simulation. In one implementation, this simulated rise time 512 can be used to determine pulse width parameters (step 520 of FIG. 6). In another implementation, an approximation 514 of the simulated rise time 512 can be used to determine pulse width parameters. The solid line 514 shows a first-order linear approximation of the simulated rise time 512, although the invention is not limited to this method of approximation. In other implementations, higher orders of approximation can also be used to determine pulse width parameters. FIG. 9 describes one implementation for how pulse width parameters can be determined using these plots.

As previously explained, the pulse width of a programming pulse is typically the same duration for each pulse of a programming signal. Usually, this pulse width is set for the worst-case scenario (i.e. highest programming voltage and/or the last memory cell on the word line) to ensure that the memory cell is properly programmed. However, each pulse does not need to be set to the worst-case scenario pulse width. For example, if the maximum programming voltage ($Vpgm_{max}$) in a programming signal for a memory cell has a rise time of 6 μs ($t_r$=63% of Vpgm), the minimum pulse width required to program the memory cell might be 15 μs. This means the pulse width would ordinarily be set to 15 μs for all pulses of a programming signal. If the minimum programming voltage ($Vpgm_{min}$) in a programming signal for a memory cell has a rise time of 2 μs, the minimum pulse width ($t_w$) required to program the memory cell might only be 5 μs. Therefore, for the minimum programming voltage ($Vpgm_{min}$), the signal is applied to the memory cell for an extra unneeded 10 μs. A process like the one described in FIG. 9 alleviates this efficiency problem by determining pulse width parameters based on the simulation of rise time.

FIG. 9 describes one process for determining pulse width parameters based on simulated pulse magnitude data (step 520 of FIG. 6), such as the simulated pulse magnitude data of FIG. 7 and FIG. 8. After the simulation results for a particular memory cell's rise time have been obtained (i.e. FIG. 8), an approximation 514 of the simulated rise time plot 512, as described above, is obtained (step 522). In step 524, the equation of the approximation 514 is calculated. This approximated equation for rise time is used to determine pulse width parameters for pulses of a programming signal (step 526). In another implementation, the pulse width parameters can be determined directly from the plot of the simulated rise time 512 instead of using the approximation plot 514. The approximated equation will be used for example purposes for the sake of simplicity.

Figure 10:
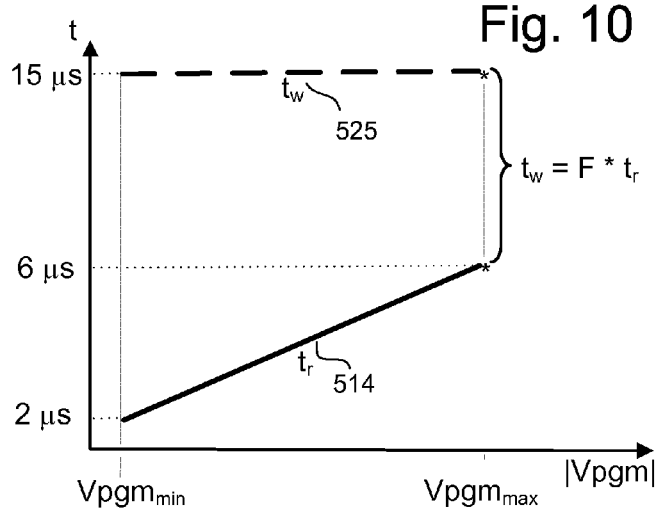
FIG. 10 is a graph that depicts one example of varying the pulse duration as a function of the pulse magnitude.

In one implementation of step 526, because the required programming pulse width is a percentage of the time it takes a programming pulse to reach its intended programming voltage, and the rise time is defined as a percentage of the time it takes a programming pulse to reach its intended programming voltage, the originally-set worst-case scenario pulse width can be scaled to the approximated equation for rise time. In one implementation, the originally-set worst-case scenario pulse width is scaled to the approximated equation for rise time by a factor determined for the highest programming voltage. For example, the scaling factor can be related to the minimum required pulse width for a maximum programming pulse voltage (i.e. 92% of $Vpgm_{max}$). FIG. 10 shows one example of how step 526 can be performed.

FIG. 10 depicts an example of how to determine the pulse width parameters for pulses of a programming signal as a function of simulated pulse magnitude data. The dashed line for pulse width ($t_w$) 525 shows the originally-set worst-case scenario pulse width used for each pulse of a programming signal. The solid line for rise time ($t_r$) 514 shows the approximation for rise time that was found in step 522 of FIG. 9. This is the same approximation 514 used in the example of FIG. 8. The equation for this first-order approximation is calculated. For example, let's say the first-order approximation equation was found to be $t_r$=Vpgm−14.

At $Vpgm_{max}$, the appropriate scaling factor F can be determined ($t_w$=F*$t_r$), as $t_w$ and $t_r$ for $Vpgm_{max}$ are both percentages of the time to reach an intended $Vpgm_{max}$ and are therefore related to one another. This ensures that the pulse width is scaled for the worst-case scenario. In this example, the factor F would equal $t_w$/$t_r$=15 μs/6 μs.

Using this factor F and the known equation for the approximated rise time, the pulse width can be scaled to the approximated rise time equation by the factor F. In this example, the pulse width parameters could be set to the scaled equation $t_w$=F*$t_r$=(15/6)*(Vpgm−14).

Figure 11:
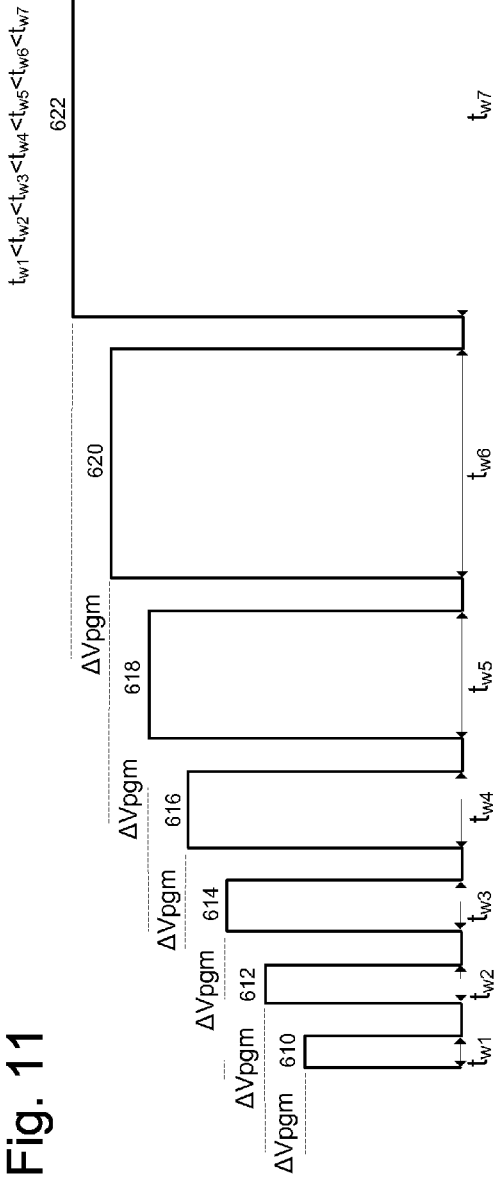
FIGS. 11-12 depict example waveforms with varied pulse duration.

As explained above, a typical programming signal is applied as a series of pulses with pulse magnitudes that increase by a constant step size (ΔVpgm) for each successive pulse while the pulse widths are the same for each pulse. FIG. 11 provides a graphical representation of an example of a series of pulses of a programming signal with pulse widths scaled according to the algorithm explained above for FIG. 10. Programming pulses 610, 612, 614, 616, 618, 620, and 622 represent pulses with pulse widths that vary as a function of increasing pulse magnitudes and pulse magnitudes that increase by a constant step size (ΔVpgm). For a programming signal with programming voltages that increase by a constant step size with each successive pulse, the pulse widths increase with each successive pulse as well. In other words, in an embodiment where the magnitude of pulses in a programming signal increases by a constant amount, the pulse widths are also a function of the pulse count.

Figure 12:
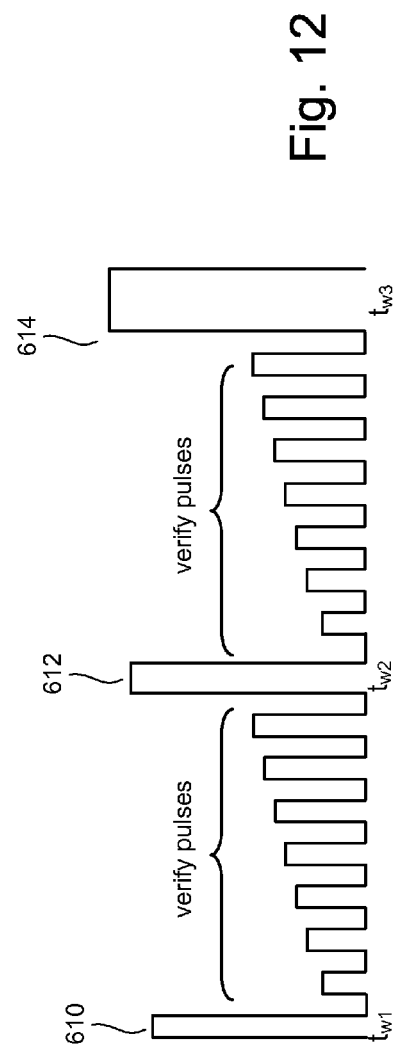

Between each programming pulse, one or more verification operations are typically performed. FIG. 12 depicts three of the programming pulses 610, 612, and 614 with seven verify pulses between each programming pulse. These verify pulses are not depicted in FIG. 11 to make the drawing easier to read. However, these verify pulses occur between each pulse of FIG. 11.

Figure 13:
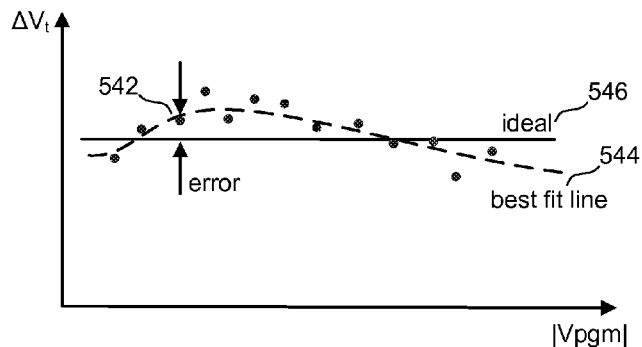
FIG. 13 is a graph describing change in threshold voltage for different pulses of a programming signal.

FIG. 13 depicts an example of results obtained during the individual memory chip testing of step 540 in FIG. 6. Ideally, the fabricated system should have a constant change in threshold voltage with each successive pulse, as depicted by the solid line 546. However, the change in threshold voltage may vary slightly as pulse magnitudes (i.e. pulse counts) increase, as indicated by the plotted points in FIG. 13. A best fit line for these points, as indicated by the dashed line 544, can be used to determine pulse magnitudes (step 550 of FIG. 6) that compensate for this error.

Figure 14A:
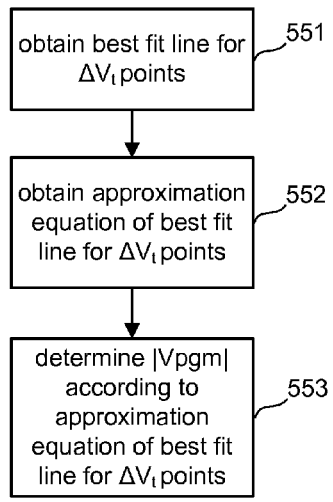
FIGS. 14A-14B are flow charts describing embodiments of processes for varying pulse magnitudes of the program voltage.
Figure 14B:
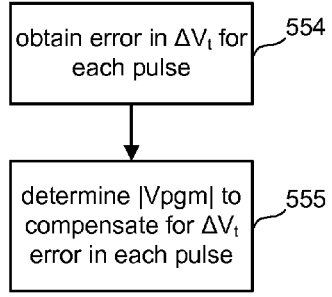

Two processes for implementing step 550 for FIG. 6 are depicted in FIG. 14A and FIG. 14B, although other processes can be used. FIG. 14A uses the best fit line of plotted threshold voltage points 544 in step 551 to determine pulse magnitudes. Once the best fit line is obtained (step 551), an equation for the approximation of the best fit line is obtained (step 552). The approximation can be any particular order of approximation for the best fit line. In step 553, the magnitudes of pulses are determined according to the approximation equation obtained in step 552.

FIG. 14B uses each data point for the change in threshold voltage for each pulse to determine pulse magnitudes. In step 554, the error in the change in threshold voltage for each pulse is calculated (i.e. the difference between the actual change in threshold voltage and the ideal change in threshold voltage). For example, the error for data point 542 in FIG. 13 would be the difference between the value of that data point and the ideal change in threshold voltage. Once the error is calculated for each pulse of a programming signal, the pulse magnitudes are determined accordingly on a pulse-by-pulse basis to compensate for this error, as described in step 555.

Although FIG. 14A and FIG. 14B provide methods for determining pulse magnitudes after fabrication of the memory chip, this does not affect the pulse widths determined through simulation. The pulse widths of applied pulses are still applied according to the determined pulse width parameters.

Furthermore, in some embodiments, the processes for using test results to determine pulse magnitudes, such as the processes of FIG. 14A and FIG. 14B (i.e. step 550 of FIG. 6), are not used at all. Instead, only the pulse widths are varied to compensate for memory chip non-idealities. This could be done using the simulation results as described in step 520 of FIG. 6. In other embodiments, the pulse widths can vary based on test results. That is, pulse widths could vary based on actual (i.e. tested), rather than simulated, pulse magnitudes.

In the embodiments described so far, one of the goals has been to effect the same change in the programmed threshold voltage for every programming pulse, irrespective of the magnitude of the pulse. In another embodiment, the memory system goes through a series of additional optimization passes. Before the beginning of these optimization passes, random data is programmed to a subset of the memory chip, and the threshold voltage distribution is measured. The data is then erased.

Each subsequent optimization pass consists of two steps. First, the random data is reprogrammed onto the chip. However, during this reprogramming, either the magnitude or duration of one of the program pulses is either increased or decreased by a small amount. There are thus at least four optimization passes (i.e. increase/decrease magnitude and increase/decrease duration) that correspond to one particular program pulse, and these four passes are applied to each program pulse.

In the second step of the optimization pass, the threshold voltage distribution is measured again. If the distributions have become narrower on this optimization pass, then the program pulse modification is kept. Otherwise, the program pulse being evaluated reverts to its original width or magnitude.

The embodiment for the series of optimization passes is not limited to four optimization passes for each pulse. For example, an optimization pass that increases the magnitude of a pulse may narrow the threshold voltage distribution by some minimum voltage. A subsequent optimization pass that further increases the magnitude of the pulse could be performed, and the threshold voltage distributions could be re-evaluated.

Figure 15:
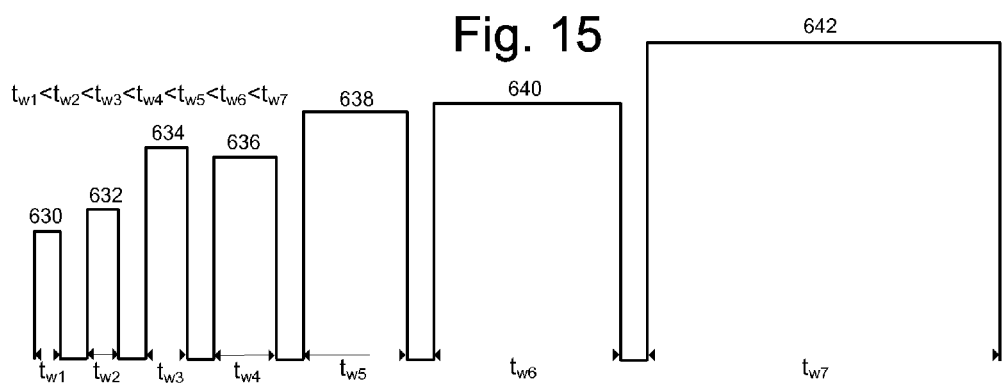
FIG. 15 depicts an example waveform with varied pulse duration and magnitude.

FIG. 15 provides a graphical representation of an example of a series of pulses of a programming signal that can be applied with pulse widths and pulse magnitudes determined according to the process of FIG. 6. Again, the pulse widths determined through simulation are not affected by the varying pulse magnitudes. Programming pulses 630, 632, 634, 636, 638, 640, and 642 represent pulses with pulse widths that vary as a function of increasing simulated pulse magnitudes and pulse magnitudes that are determined on a pulse-by-pulse basis according to the process of FIG. 14B. Once again, between each of the programming pulses 630, 632, 634, 636, 638, 640, and 642, one or more verification operations are typically performed.

At the end of a successful programming process (with verification), the threshold voltages of the memory cells should be within one or more distributions of threshold voltages for programmed memory cells or within a distribution of threshold voltages for erased memory cells, as appropriate. FIG. 16 illustrates example threshold voltage distributions (or data states) for the memory cell array when each memory cell stores three bits of data. Other embodiments, however, may use more or less than three bits of data per memory cell (e.g., such as four or more bits of data per memory cell).

In the example of FIG. 16, each memory cell stores three bits of data; therefore, there are eight valid data states S0-S7. In one embodiment, data state S0 is below 0 volts and data states S1-S7 are above 0 Volts. In other embodiments, all eight data states are above 0 volts, or other arrangements can be implemented. In one embodiment, the threshold voltage distribution S0 is wider than distributions S1-S7.

Each data state corresponds to a unique value for the three bits stored in the memory cell. In one embodiment, S0=111, S1=110, S2=101, S3=100, S4=011, S5=010, S6=001 and S7=000. Other mapping of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page and a third page. In some embodiments, all of the memory cells connected to the same word line would store data in the same three pages of data. In some embodiments, the memory cells connected to a word line can be grouped in to different sets of pages (e.g., by odd and even bit lines).

In some prior art devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 16.

FIGS. 17A-17I disclose another process for programming non-volatile memory that reduces the effect of floating gate to floating gate coupling by, for any particular memory cell, writing to that particular memory cell with respect to a particular page subsequent to writing to adjacent memory cells for previous pages. The process of FIGS. 17A-17I is a three step programming process. Prior to the first step, the memory cells will be erased so that they are in the erase threshold distribution of state S0.

The process of FIGS. 17A-17I assumes that each memory cell stores three bits of data, with each bit being in a different page. The first bit of data (the leftmost bit) is associated with the first page. The middle bit is associated with the second page. The rightmost bit is associated with the third page. The correlation of data states to data is as follows: S0=111, S1=110, S2=101, S3=100, S4=011, S5=010, S6=001 and S7=000. However, other embodiments can use other data encoding schemes.

Figure 17A:
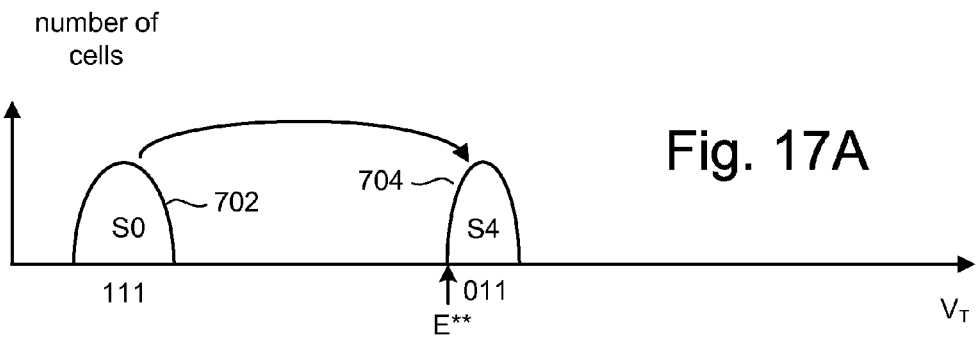
Figure 17B:
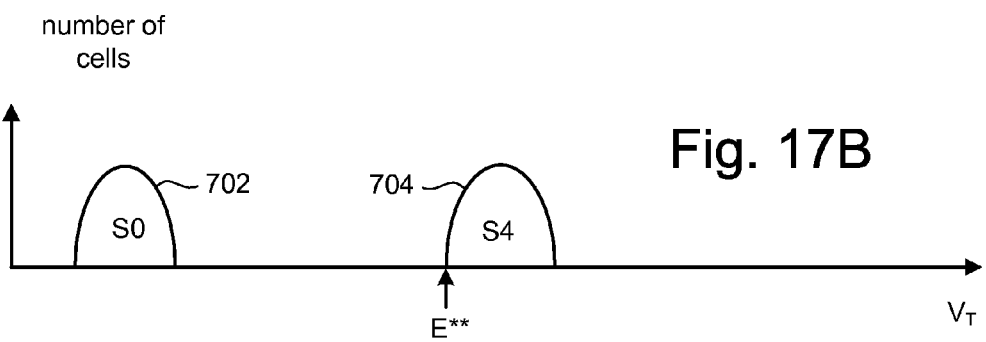

When programming the first page (as described in FIG. 17A), if the bit is to be data "1" then the memory cell will stay in state S0 (threshold voltage distribution 702). If the bit is to be data "0" then the memory cell is programmed to state S4 (threshold voltage distribution 704). After adjacent memory cells are programmed, capacitive coupling between adjacent floating gates may cause the state S4 to widen as depicted in FIG. 17B. State S0 may also widen, but there is sufficient margin between S0 and S1 to ignore the effect. More information about capacitive coupling between adjacent floating gates can be found in U.S. Pat. Nos. 5,867,429 and 6,657,891, both of which are incorporated herein by reference in their entirety.

Figure 17C:
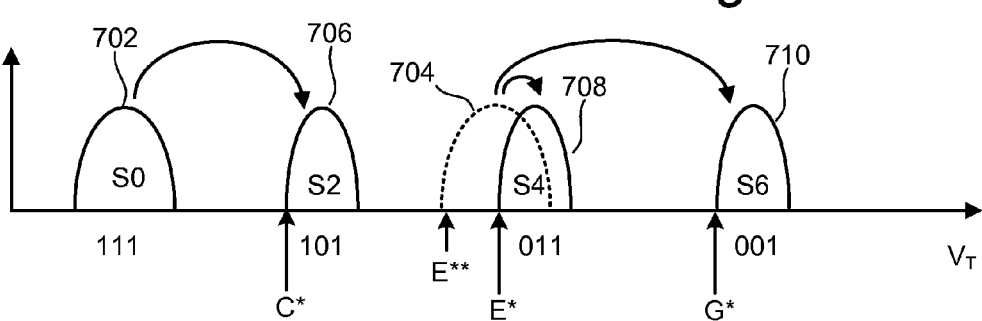

When programming the second page (see FIG. 17C), if the memory cell is in state S0 and the second page bit is data "1" then the memory cell stays in state S0. In some embodiments, the programming process for the second page will tighten threshold voltage distribution 702 to a new S0. If the memory cell was in state S0 and the data to be written to the second page is "0", then the memory cell is moved to state S2 (threshold voltage distribution 706). State S2 has a verify point (lowest voltage) of C*. If the memory cell was in state S4 and the data to be written to the memory cell is "1" then the memory cell remains in S4. However, state S4 is tightened by moving the memory cells from threshold voltage distribution 504 to threshold voltage distribution 708 for state S4, as depicted in FIG. 17C. Threshold voltage distribution 708 has a verify point of E* (as compared to E** of threshold voltage distribution 704). If the memory cell is in state S4 and the data to be written to the second page is a "0" then the memory cell has its threshold voltage moved to state S6 (threshold voltage distribution 710), with a verify point of G*.

Figure 17D:
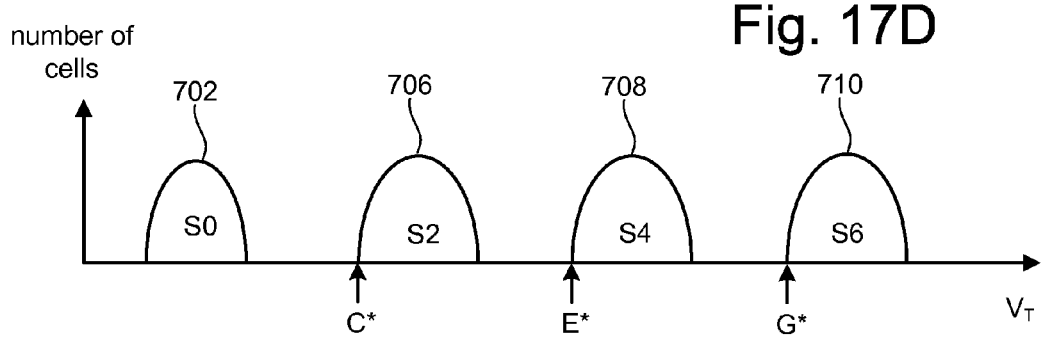

After the adjacent memory cells are programmed, the states S2, S4 and S6 are widened due to the floating gate to floating gate coupling, as depicted by threshold voltages distributions 706, 708 and 710 of FIG. 17D. In some cases, state S0 may also widen.

FIGS. 17E, 17F, 17G and 17H depict the programming of the third page. While one graph can be used to show the programming, the process is depicted in four graphs for visibility reasons. After the second page has been programmed, the memory cells are either in states S0, S2, S4 or S6. FIG. 17E shows the memory cell that is in state S0 being programmed for the third page. FIG. 17F shows the memory cell that is state S2 being programmed for the third page. FIG. 17G shows the memory cell that is in state S4 being programmed for the third page. FIG. 17H shows the memory cell that is in state S6 being programmed for the third page. FIG. 17I shows the threshold voltage distributions after the processes of FIGS. 17E, 17F, 17G and 17H have been performed on the population of memory cells (concurrently or serially).

If the memory cell is in state S0 and the third page data is "1" then the memory cell remains at state S0. If the data for the third page is "0" then the threshold voltage for the memory cell is raised to be in state S1, with a verify point of B (see FIG. 17E).

If the memory cells in state S2 and the data to be written in the third page is "1", then the memory cell will remain in state S2 (see FIG. 17F). However, some programming will be performed to tighten the threshold distribution 706 to a new state S2 with a verify point of C volts. If the data to be written to the third page is "0," then the memory cell will be programmed to state S3, with a verify point of D volts.

If the memory cell is in state S4 and the data to be written to the third page is "1" then the memory cell will remain in state S4 (see FIG. 17G). However, some programming will be performed so that threshold voltage distribution 708 will be tightened to new state S4 with a verify point of E. If the memory cell is in state S4 and the data to be written to the third page is "0" then the memory cell will have its threshold voltage raised to be in state S5, with a verify point of F.

If the memory cell is in state S6 and the data to be written to the third page is "1" then the memory cell will remain in state S6 (see FIG. 17H). However, there will be some programming so that the threshold voltage distribution 710 is tightened to be in new state S6, with a verify point at G. If the third page data is "0" then the memory cell will have its threshold voltage programmed to state S7, with a verify point at H. At the conclusion of the programming of the third page, the memory cell will be in one of the eight states depicted in FIG. 17I.

FIG. 18 depicts one example of an order for programming the pages of a set or memory cells. The table provides the order for programming with respect to the four word lines (WL0, WL1, WL2 and WL3) of FIG. 5; however, the table can be adapted to accommodate more or less than four word lines. The first page of the memory cells connected to WL0 are programmed, followed by the programming of the first page of the memory cells connected to WL1, followed by the programming of the second page of the memory cells connected to WL0, followed by the programming of the first page of the memory cells connected to WL2, followed by the programming of the second page of the memory cells connected to WL1, etc.

FIG. 19 is a flow chart describing a programming process for programming memory cells connected to a selected word line. In one embodiment, the process of FIG. 19 is used to program a block of memory cells. In one implementation of the process of FIG. 19, memory cells are pre-programmed in order to maintain even wear on the memory cells (step 650). In one embodiment, the memory cells are preprogrammed to state 7, a random pattern, or any other pattern. In some implementations, pre-programming need not be performed.

In step 652, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. In one embodiment, after erasing the memory cells, all of the erased memory cells will be in state S0 (see FIG. 16).

At step 654, soft programming is performed to narrow the distribution of erased threshold voltages for the erased memory cells. Some memory cells may be in a deeper erased state than necessary as a result of the erase process. Soft programming can apply programming pulses to move the threshold voltage of the erased memory cells closer to the erase verify level. For example, looking at FIG. 16, step 654 can include tightening the threshold voltage distribution associated with state S0. In step 656, the memory cells of the block are programmed as described herein. The process of FIG. 19 can be performed at the direction of the state machine using the various circuits described above. In other embodiments, the process of FIG. 19 can be performed at the direction of the controller using the various circuits described above. After performing the process of FIG. 19, the memory cells of the block can be read.

Figure 20:
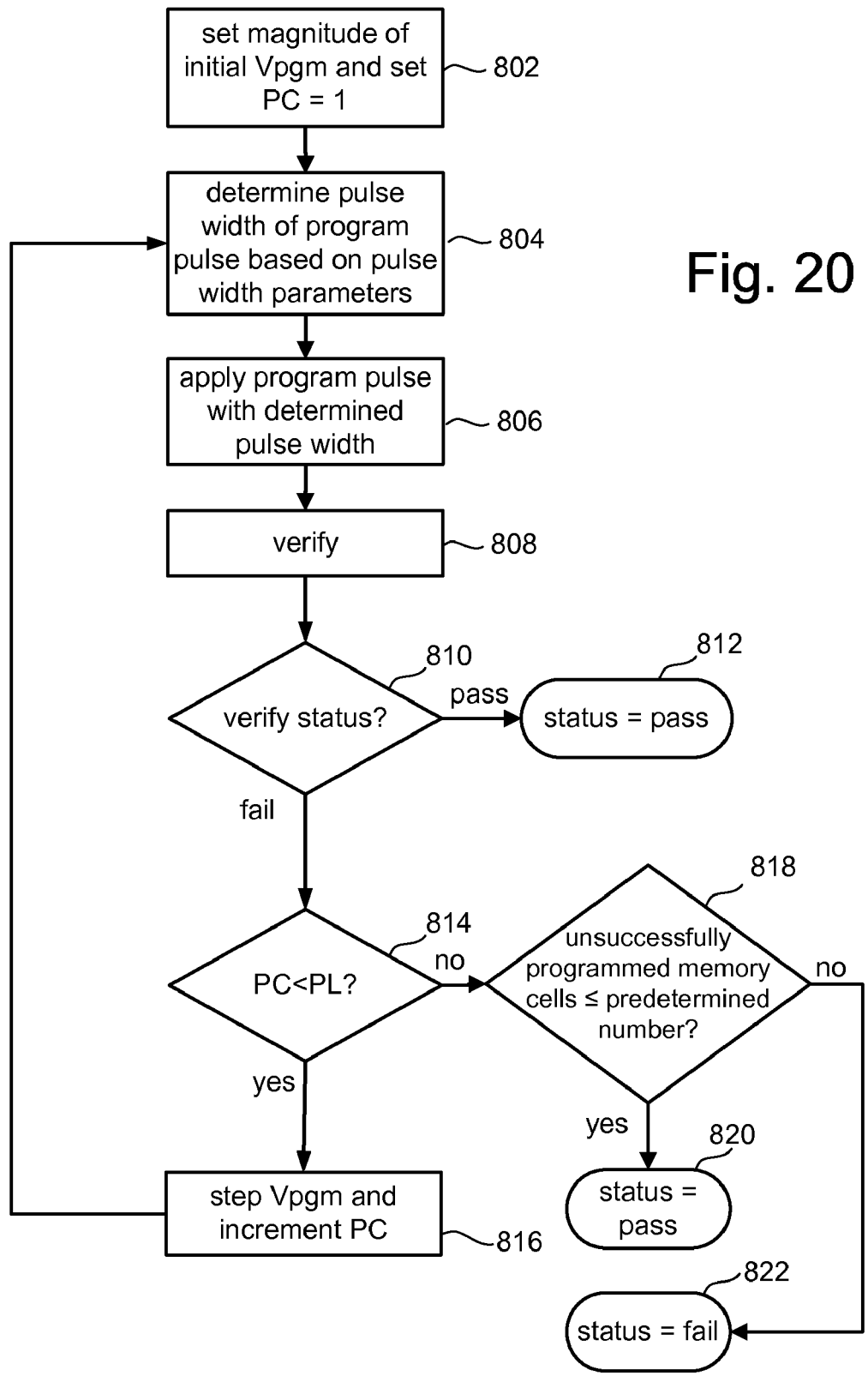
FIG. 20 is a flow chart describing one embodiment of a process for programming non-volatile memory elements.

FIG. 20 is a flow chart of a process for performing programming on memory cells connected to a common word line. The process of FIG. 20 can be performed one or multiple times during step 656 of FIG. 19. For example, the process of FIG. 20 can be used to perform the full sequence programming of FIG. 16, in which case the process of FIG. 20 would be performed once for each word line. In one embodiment, the programming process is performed in an order that starts from the word line closest to the source line, working toward the bit line. The process of FIG. 20 can also be used to perform the programming of a page of data for a word line, with respect to the programming process of FIGS. 17A-17I, in which case the process of FIG. 20 would be performed three times for each word line. Other arrangements can also be used.

Typically, the program voltage applied to the control gate during a program operation is applied as a series of program pulses. In between programming pulses are a set of verify pulses to enable verification. In many implementations, the magnitude of the program pulses is increased with each successive pulse by a predetermined step size. In step 802, the programming voltage (Vpgm) is initialized to the starting magnitude (e.g., ~12V or another suitable level) and a program counter PC maintained by state machine 222 is initialized at 1.

At step 804, the pulse width is determined based on the pulse width parameters determined in step 520 of FIG. 6. As previously explained, the pulse width parameters indicate the size of the pulse width to be applied for each pulse of a programming signal (i.e. pulse count). In some embodiments, step 804 includes determining pulse magnitude based on the pulse magnitudes programmed into registers of the control circuitry 220 (FIG. 3), as described for step 550 of FIG. 6. At step 806, a programming pulse of the programming signal is applied to the selected word line (the word line selected for programming). The programming pulse is applied with the determined pulse width of step 804. In some embodiments, the program pulse can be applied with the pulse magnitude determined in step 550 of FIG. 6 and stored into the registers of the control circuitry 220. The unselected word lines receive one or more boosting voltages (e.g., ~8 volts) to perform boosting schemes known in the art. If a memory cell should be programmed, then the corresponding bit line is grounded. On the other hand, if the memory cell should remain in its current data state, then the corresponding bit line is connected to $V_{DD}$ to inhibit programming. More information about boosting schemes can be found in U.S. Pat. No. 6,859,397 and U.S. patent application Ser. No. 11/555,850, both of which are incorporated herein by reference.

At step 808, the states of the selected memory cells are verified using the appropriate set of target levels. If it is detected that the threshold voltage of a selected memory cell has reached the appropriate target level, then the memory cell is locked out of further programming by, for example, raising its bit line voltage during subsequent programming pulses. In step 810, it is checked whether all of memory cells have reached their target threshold voltages. If so, the programming process is complete and successful because all selected memory cells were programmed and verified to their target states. A status of "PASS" is reported at step 812. Note that in some implementations, at step 810 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, at step 810, it is determined that not all of the memory cells have reached their target threshold voltages, then the programming process continues. At step 814, the program counter PC is checked against a program limit value (PL). One example of a program limit value is 20; however, other values can be used in various implementations. If the program counter PC is not less than the program limit value, then it is determined at step 818 whether the number of memory cells that have not been successfully programmed is equal to or less than a predetermined number. If the number of unsuccessfully programmed memory cells is equal to or less than the predetermined number, then the programming process is flagged as passed and a status of PASS is reported at step 820. In many cases, the memory cells that are not successfully programmed can be corrected using error correction during the read process. If however, the number of unsuccessfully programmed memory cells is greater than the predetermined number, the program process is flagged as failed and a status of FAIL is reported at step 822.

If in step 814 it is determined that the program counter PC is less than the program limit value PL, then in step 816 the magnitude of the next program signal (Vpgm) voltage pulse is increased by the step size (e.g., 0.2-0.4 volt step size) or by pulse magnitudes in the register and the program counter PC is incremented. After step 816, the process loops back to step 804 to determine the next pulse width for the Vpgm voltage pulse.

Step 808 of FIG. 20 includes performing one or more verify operations. In general, during verify operations and read operations, the selected word line is connected to a voltage, a level of which is specified for each read and verify operation (e.g. see B, C, D, E, F, G and H of FIG. 17I) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming non-volatile storage, comprising:
   determining pulse widths for a plurality of memory devices including determining pulse widths for multiple programming pulses of a programming signal based on a simulation of said plurality of memory devices;
   calculating pulse magnitudes for said multiple programming pulses of said programming signal for a particular memory device from said plurality of memory devices, said calculating is performed subsequent to fabrication of said particular memory device; and
   applying said programming signal to said particular memory device.

2. A method according to claim 1, wherein:
   said step of applying said programming signal is concurrently performed for multiple non-volatile storage elements of said particular memory device.

3. A method according to claim 1, wherein:
said step of determining pulse widths includes determining pulse widths based on pulse magnitudes observed during simulation of said plurality of memory devices; and
said step of applying said programming signal includes applying multiple programming pulses with pulse widths that vary as a function of said pulse magnitudes observed during simulation.

4. A method according to claim 1, wherein:
said step of calculating pulse magnitudes includes calculating pulse magnitudes for individual pulses of said multiple programming pulses.

5. A method according to claim 1, wherein:
said step of calculating pulse magnitudes includes calculating pulse magnitudes based on a physical test of said particular memory device.

6. A method according to claim 1, wherein:
said step of calculating pulse magnitudes includes calculating pulse magnitudes based on measured changes in threshold voltage for said particular memory device; and
said step of applying said programming signal includes applying multiple programming pulses with pulse magnitudes that vary as a function of said measured changes in threshold voltage for said particular memory device.

7. A non-volatile storage system, comprising:
a particular memory device from a plurality of memory devices; and
one or more managing circuits in communication with said particular memory device, said one or more managing circuits program said particular memory device by applying programming pulses with pulse widths determined based on a simulation of said plurality of memory devices, said one or more managing circuits apply said programming pulses with pulse magnitudes calculated subsequent to fabrication of said particular memory device.

8. A non-volatile storage system according to claim 7, wherein:
said one or more managing circuits concurrently apply said programming pulses to multiple non-volatile storage elements of said particular memory device.

9. A non-volatile storage system according to claim 7, wherein:
said one or more managing circuits apply said programming pulses with pulse widths determined based on pulse magnitudes observed during simulation of said plurality of memory devices; and
said one or more managing circuits apply said programming pulses with pulse widths that vary as a function of said pulse magnitudes observed during simulation.

10. A non-volatile storage system according to claim 7, wherein:
said one or more managing circuits apply said programming pulses with pulse magnitudes calculated for individual pulses of said programming pulses.

11. A non-volatile storage system according to claim 7, wherein:
said one or more managing circuits apply said programming pulses with pulse magnitudes calculated based on a physical test of said particular memory device.

12. A non-volatile storage system according to claim 7, wherein:
said one or more managing circuits apply said programming pulses with pulse magnitudes calculated based on measured changes in threshold voltage for said particular memory device; and
said one or more managing circuits apply said programming pulses with pulse magnitudes that vary as a function of said measured changes in threshold voltage for said particular memory device.

* * * * *